US009229466B2

(12) United States Patent
Saraswat et al.

(10) Patent No.: US 9,229,466 B2
(45) Date of Patent: Jan. 5, 2016

(54) FULLY INTEGRATED VOLTAGE REGULATORS FOR MULTI-STACK INTEGRATED CIRCUIT ARCHITECTURES

(75) Inventors: Ruchir Saraswat, Swindon (GB); Andre Schaefer, Braunschweig (DE); Uwe Zillman, Braunschweig (DE); Andreas Duevel, Almstedt (DE); Valluri Rao, Saratoga, CA (US); Telesphor Kamgaing, Chandler, AZ (US); Harish Krishnamurthy, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 198 days.

(21) Appl. No.: 13/977,460

(22) PCT Filed: Dec. 31, 2011

(86) PCT No.: PCT/US2011/068285
§ 371 (c)(1),
(2), (4) Date: Jun. 28, 2013

(87) PCT Pub. No.: WO2013/101249
PCT Pub. Date: Jul. 4, 2013

(65) Prior Publication Data
US 2013/0335059 A1    Dec. 19, 2013

(51) Int. Cl.
*H01L 27/06*   (2006.01)
*G05F 1/618*   (2006.01)
(Continued)

(52) U.S. Cl.
CPC .............. *G05F 1/618* (2013.01); *H01L 23/481* (2013.01); *H01L 23/5227* (2013.01);
(Continued)

(58) Field of Classification Search
CPC ............................................. H01L 2924/1427
See application file for complete search history.

(56) References Cited

U.S. PATENT DOCUMENTS 7,948,346 B2 *   5/2011   Hebert ................ H01F 17/0033
                                                                  336/200
8,339,233 B2 *  12/2012   Tsai .................... H01F 17/0013
                                                                  336/200

(Continued)

FOREIGN PATENT DOCUMENTS

KR     100048260 A     5/2007
KR     100079815 A     7/2011

OTHER PUBLICATIONS

International Search Report and Written Opinion, Sep. 28, 2012, 9 pages, International Application No. PCT/US2011/068285, Korean Intellectual Property Office, Metropolitan City, Korea.

*Primary Examiner* — Lex Malsawma
(74) *Attorney, Agent, or Firm* — Marger Johnson (57)    ABSTRACT

A voltage regulator for one or more dies in a multi-stack integrated circuit includes an inductor located on a die, a voltage controller that is electrically coupled to the inductor and is also located on the die, and a capacitor that is electrically coupled to the inductor and the voltage controller and is also located on the die. The inductor defines an interior space and the voltage controller and the capacitor are located within the interior space of the inductor. The inductor can be a lateral inductor or a through layer via inductor. The multi-stack integrated circuit may have multiple dies. A voltage controller may be electrically coupled to each of the dies, although it may be located on only one of the dies. Alternatively, separate voltage controllers may be electrically coupled to each of the multiple dies and may be located on each of the respective dies.

25 Claims, 7 Drawing Sheets (51) Int. Cl.
    *H02M 3/156*     (2006.01)
    *H01L 25/065*     (2006.01)
    *H01L 27/02*     (2006.01)
    *H01L 49/02*     (2006.01)
    *H01L 23/48*     (2006.01)
    *H01L 23/64*     (2006.01)
    *H01L 25/18*     (2006.01)
    *H01L 23/522*     (2006.01)
    *H02M 7/00*     (2006.01)

(52) U.S. Cl.
    CPC ........... *H01L 23/642* (2013.01); *H01L 23/645* (2013.01); *H01L 25/0657* (2013.01); *H01L 25/18* (2013.01); *H01L 27/0207* (2013.01); *H01L 28/10* (2013.01); *H01L 28/40* (2013.01); *H02M 3/156* (2013.01); *H01L 23/5223* (2013.01); *H01L 2225/06513* (2013.01); *H01L 2225/06544* (2013.01); *H01L 2225/06565* (2013.01); *H01L 2924/0002* (2013.01); *H02M 7/003* (2013.01)

(56) References Cited

U.S. PATENT DOCUMENTS

| | | | |
|---|---|---|---|
| 2002/0057173 A1* | 5/2002 | Johnson | 336/200 |
| 2004/0222773 A1 | 11/2004 | Gardner et al. | |
| 2008/0143468 A1* | 6/2008 | Yokoyama | H01F 1/342 336/200 |
| 2008/0309442 A1 | 12/2008 | Hebert | |
| 2009/0090995 A1* | 4/2009 | Yang et al. | 257/531 |
| 2009/0134964 A1* | 5/2009 | Hebert | H01F 17/062 336/200 |
| 2010/0193905 A1* | 8/2010 | Kim et al. | 257/531 |
| 2010/0207594 A1* | 8/2010 | Davoudi et al. | 323/283 |
| 2011/0084765 A1* | 4/2011 | Kim et al. | 330/277 |
| 2011/0133879 A1* | 6/2011 | Chiu et al. | 336/200 |
| 2011/0260819 A1* | 10/2011 | Yeh et al. | 336/155 |
| 2013/0020675 A1* | 1/2013 | Kireev et al. | 257/531 |
| 2013/0027127 A1* | 1/2013 | Topaloglu | 327/564 |
| 2013/0056847 A1* | 3/2013 | Chen | 257/531 |
| 2013/0094157 A1* | 4/2013 | Giuliano | 361/748 |
| 2014/0217546 A1* | 8/2014 | Yen et al. | 257/531 |

\* cited by examiner

FULLY INTEGRATED VOLTAGE REGULATORS FOR MULTI-STACK INTEGRATED CIRCUIT ARCHITECTURES

TECHNICAL FIELD

The disclosure relates generally to voltage regulators, and more specifically to fully integrated voltage regulators for multi-stack integrated circuit architectures.

BACKGROUND

Integrated circuits include various circuit components that are integrated into a piece of semiconductor material, or "die," which may be encapsulated within and secured to a package. Integrated circuit packaging technology has been evolving and now requires increasingly smaller packages as the demand for greater function and smaller sized electronics increases. A package may include one or more dies, electrically connected to one another. Packages having more than one die are multi-chip modules (MCMs). Dies within an MCM may be positioned in a horizontal or vertical relationship with one another, or both, and electrical connections run between the dies within the MCM. The combination of the vertical and horizontal circuit connection capabilities saves valuable space on the package and results in greater functionality in less space.

Each die in an integrated circuit package requires a certain amount of power to function properly. Required voltage rails are typically delivered to each individual die by a voltage regulator. With the increasing number of dies in multi-stacked chip configurations, a greater number of voltage regulators are required. Oftentimes, different dies within an MCM require different operation voltages. Voltage regulators regulate the voltage, and thus the power that is distributed to the various die layers in a multi-stacked package. Voltage regulators tend to be physically large and take up large area. Many techniques have been developed to accommodate for this issue, such as including the voltage regulator on a circuit board that supports the package or into the package itself. These options limit speeds for the function of the components on the die because of the physical distance between the electronic components and the voltage regulator. Further, regulators that include on package inductors require additional space on the package. Having multiple inductors on package might not be possible in many cases due to area constraints.

Thus, there remains a need for improved voltage regulation architectures for three-dimensional integrated circuit packages.

BRIEF DESCRIPTION OF THE DRAWINGS

Embodiments of the present invention are illustrated by way of example, and not by way of limitation, in the drawings and in which like reference numerals refer to similar elements.

DETAILED DESCRIPTION

Figure 1:
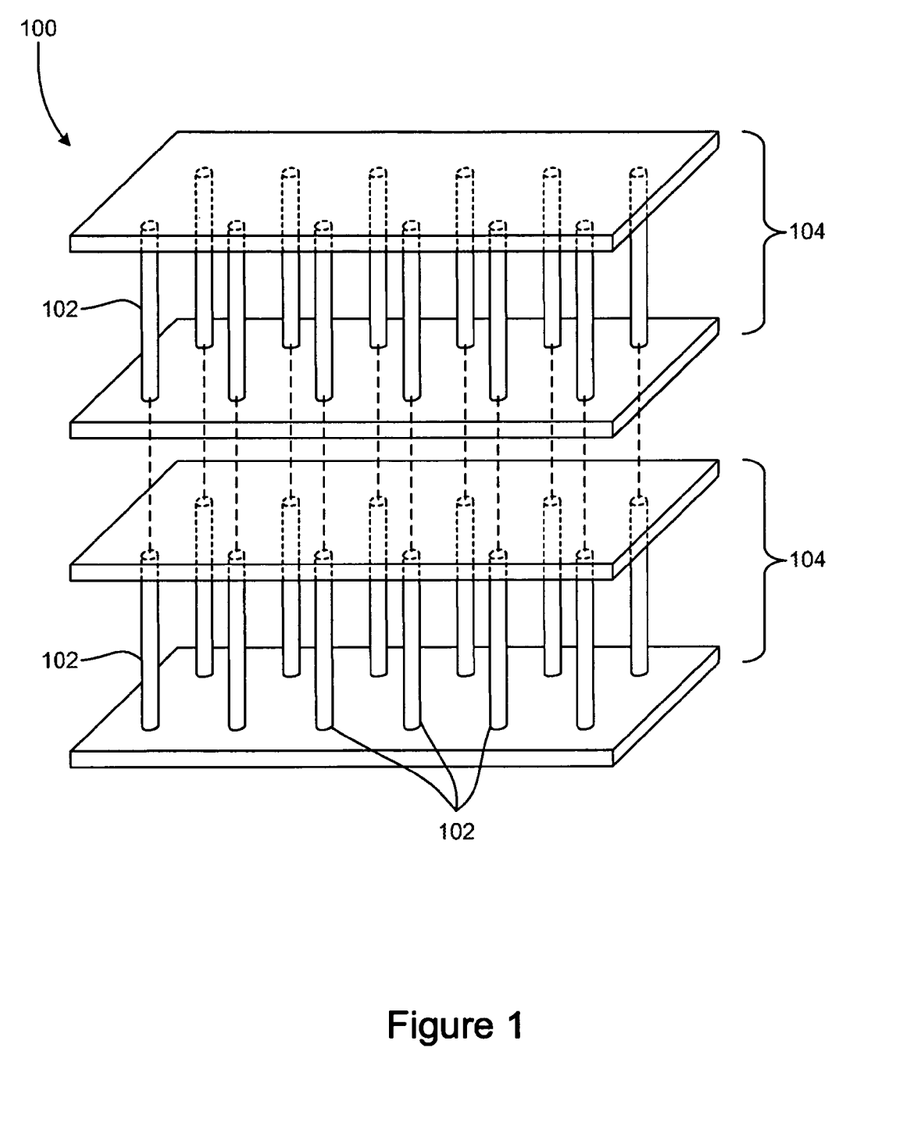
FIG. 1 is a perspective view diagram of a multi-stack integrated circuit architecture showing multiple through silicon vias.

FIG. 1 illustrates a multi-stack integrated circuit architecture 100 with multiple through silicon vias 102 (TSVs) extending through each of two dies 104. For clarity, the bulk of the dies 104 is not illustrated. Any suitable number of dies 104 may be included in the stack. The through silicon vias 102 extend through the entire thickness of each die 104 in the examples shown in FIG. 1, although in alternative examples, one or more of the through silicon vias 102 extends partially through the thickness of the die 104. The vias 102 provide an electrical connection between layers in the die 104 and can form portions of components or connections between components. Although not shown in FIG. 1 for sake of clarity, the dies 104 may be electrically coupled to each other by wires or other electrical connections between the dies so that the integrated circuit may use the vertical stacks for circuit connections and components.

Figure 2:
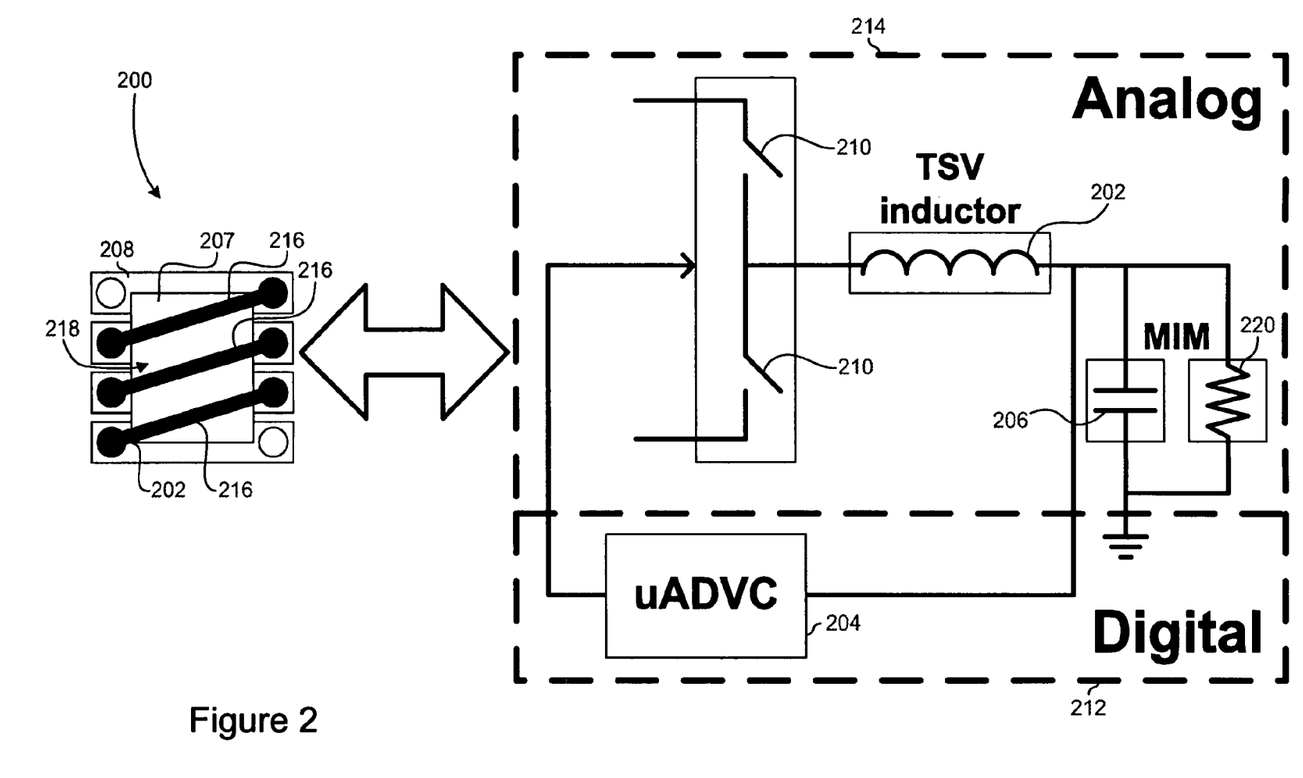
FIG. 2 is a block diagram of an integrated voltage regulator, according to embodiments of the invention.

FIG. 2 shows a block diagram of an integrated voltage regulator 200 that regulates voltage to one of the more the dies shown in FIG. 1. The integrated voltage regulator 200 in this example includes an inductor 202, a voltage controller 204, and a capacitor 206. The inductor 202, the capacitor 206 and a driver/pre-driver 221 form a power stage 207. The voltage controller 204 controls the duty cycle of a switching clock that is electrically coupled to the power stage. In some examples, the voltage controller 204 controls the switching clocks of multiple power stages in multiple dies and in other examples, each die in a multi-stack package has a dedicated voltage controller controlling the switching clock electrically coupled to the power stage. Referring again to FIG. 2, the inductor 202 is located on a die 208 of an integrated circuit and is a through silicon via (TSV) inductor, although it may be any other type of through layer via inductor or a lateral inductor in other configurations, as described below. The voltage controller 204 may be a micro advanced digital voltage controller, for instance. Other digital and non-digital voltage controllers also may be used without deviating from the scope of embodiments of the invention. The capacitor 206 may be a metal insulated metal (MIM) capacitor, although other types of capacitors may be used in alternative configurations. The voltage controller 204 controls the duty cycle of the cloak and the clock controls the driver/pre-driver. The driver/pre-driver is connected to the inductor 202, which is connected to the capacitor 206. The capacitor 206 provides a feedback connection to the voltage controller 204.

The digital voltage controller 204 is a fully digital, synthesizable, inner loop for switching frequencies in the range of 200-500 mHz per phase and enhances the returns by presenting a completely synthesizable, scalable, and reusable block that is electrically coupled to a power management unit (not shown in FIG. 2), which is collocated and enhances the overall efficiency of the system. The digital voltage controller 204 defines a digital portion 212 of the integrated voltage regulator 200 while the inductor 202, the capacitor 206, and other components define an analog portion 214 of the integrated voltage regulator 200.

The inductor 202 includes one or more coils 216 that define an interior space 218 within the coils 216. In some embodiments, the voltage controller 204, the capacitor 206, and the driver/pre-driver 221 are located within the interior space 218 of the inductor 202 further saving die area. The inductor 202 is located on the die 208 and thus the voltage controller 204, the capacitor 206 and pre-driver/driver 221 are also located on the die 208 because they are located within the interior space 218 of the inductor 202. This configuration forms a fully integrated voltage regulator 200 that is located entirely on the die 208.

Optionally, the voltage regulator 200 includes a load 220 on the die that is indicated in FIG. 2 by a resistor symbol. The die load 220 may be electrically coupled in parallel to the capacitor 206, as shown in FIG. 2. This load represents any load.

Figure 3:
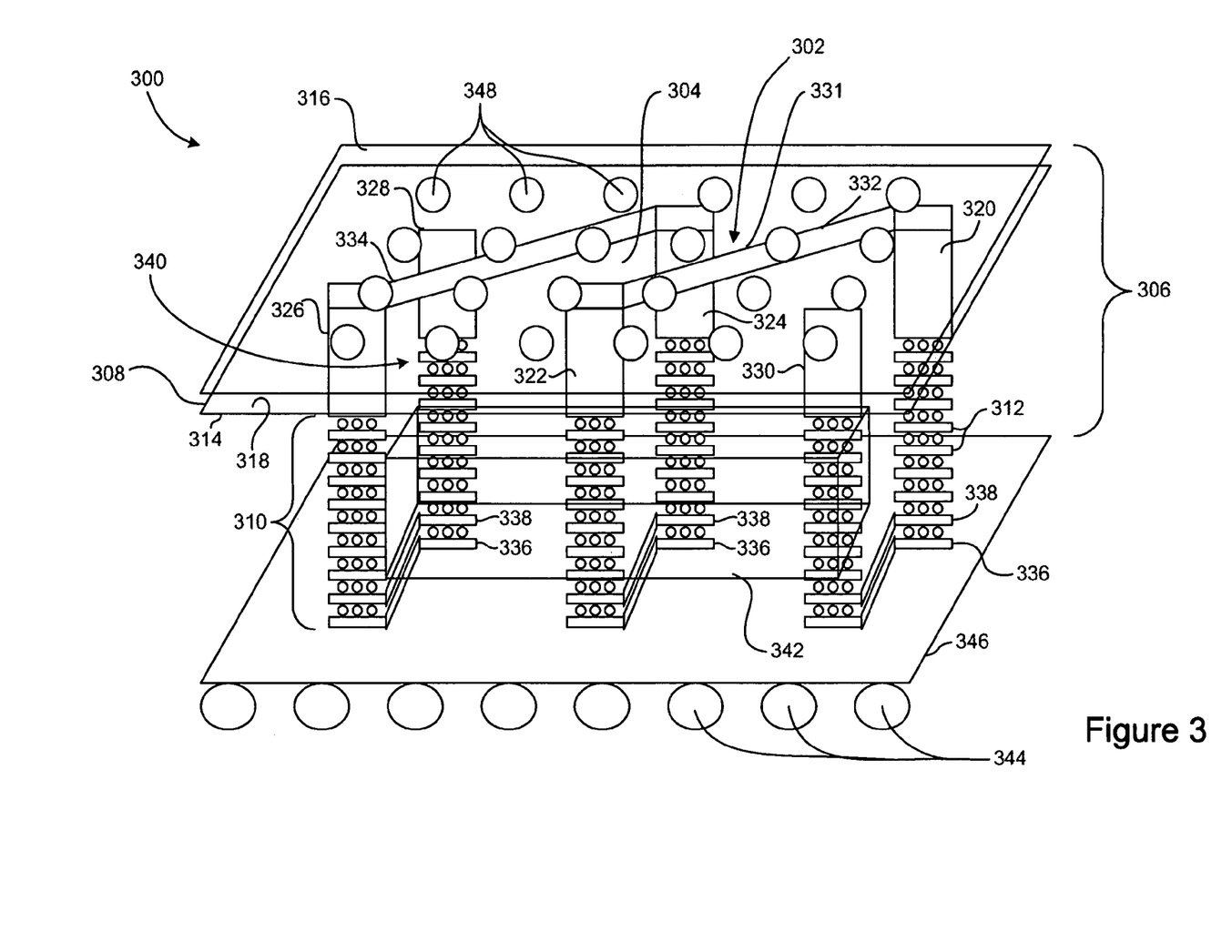
FIG. 3 is perspective view diagram of a die in an integrated circuit package that includes an integrated voltage regulator in an interior portion of the die, according to embodiments of the invention.

FIG. 3 illustrates an inductor that is externally connected to a die 300. The inductor 302 in this example is located in an interior portion 304 of the die 300. In the example shown in FIG. 3, a silicon die 306 includes bulk silicon 308 and a metal, stack 310 that includes multiple metal layers 312. The frontside of the silicon die 306 is the exterior surface of the metal stack portion 310 and the backside of the silicon die 306 is the surface on which a redistribution layer 316 is secured. In this example, the redistribution layer 316 serves to redistribute power through the die 306 and serve as a layer through which electrical connections may be made. The bulk silicon 308 of FIG. 3 includes six through silicon vias 320, 322, 324, 326, 328, 330 that create an electrical connection through the thickness of the bulk silicon 308. Each through silicon via corresponds to a respective metal layer in the metal stack.

The inductor 331 shown in FIG. 3 has two coils 332, 334 in this example. A first coil 332 extends along a first 336 and a second 338 metal layer in the metal stack 310 and up through a first through silicon via 320 in the bulk silicon 308. The first coil 332 extends into the redistribution layer 316 and through the redistribution layer 316 to the second through silicon via 322. The first coil 332 extends down through the second through silicon via 322 and back into the first 336 and second 338 metal layers, thus completing a loop and defining the first coil 332. The first coil 332 and the second coil 334 are a continuous structure, however, for clarity, they are being discussed as distinct structures herein. The second coil 334 repeats a similar loop to the first coil 332 through the bulk silicon 308 and the metal stack 310. The second coil 334 extends along the first 336 and second 338 metal layers of the metal stack 310 and up through a third through silicon via 324 in the bulk silicon 308. The second coil 334 then extends into the redistribution layer 316 to a fourth through silicon via 326 and back down the fourth through silicon via 326 to the first 336 and second 338 metal layers in the metal stack 310. Because the first coil 332 and the second coil 334 extend into the redistribution layer 316 and only use the through silicon vias 320, 322, 324, 326 within the bulk silicon 308 and the metal stacks 338 within the active silicon area, the portion of the active silicon die 306 within the coils 340 remains available for other components and connections, such as the voltage regulator described above. Other configurations of the voltage regulator may include more or fewer coils of the inductor. Regardless of the number of coils, the interior space of the inductor is defined by all of the coils. The example inductor shown in FIGS. 1-3 is a solenoid with silicon as the core.

As discussed above, the first coil 332 and the second coil 334 together define the interior space 340 of the inductor 331 shown in FIG. 3. An embedded power stage 342 is located within the interior space 340 of the inductor 331 and contains the voltage controller, the capacitor, and optionally the resistor that are described in reference to FIG. 2. The embedded power stage 342 is located within the interior space 340 of the inductor, although in other embodiments it may be located elsewhere on the die 306. Various solder bumps 344 are positioned along a contact surface 346 for connections to other components. A second set of solder bumps 348 are positioned along the redistribution layer 316 to connect the redistribution layer 316 to other components.

Figure 4:
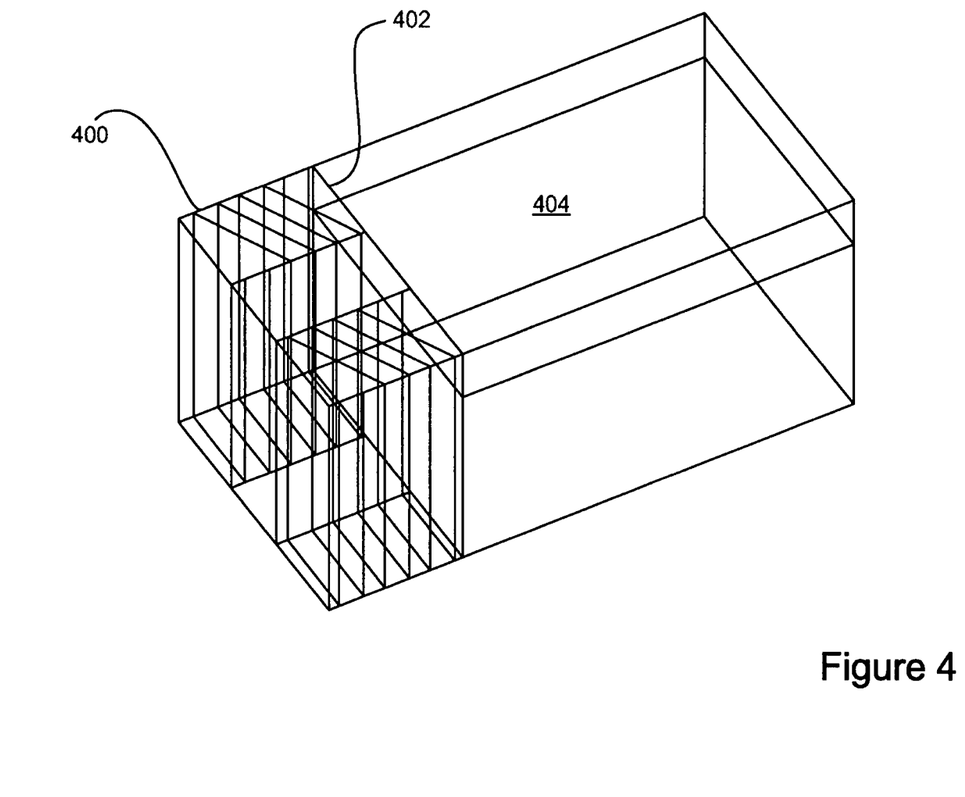
FIG. 4 is a perspective view of a diagram of a die in an integrated circuit package that includes an integrated voltage regulator located along a perimeter of the die, according to embodiments of the invention.

The inductor 331 and the embedded power stage 342 and voltage controller (not shown in FIG. 3) combination are positioned within the interior portion 304 of the die 306 in the example shown in FIG. 3. FIG. 4 shows an example in which the voltage regulator 400 is located along a perimeter 402 of the die 404. The voltage regulator 400 may be positioned along any portion of the perimeter 402 of the die 404. Generally, the voltage regulator may be positioned in any suitable portion of the die.

The inductors described above are TSV inductors that can be a single, dual, or four phase interleaved structure, for example. As the value of inductance, which corresponds to an increase in the number turns or increase in the diameter of the coil, of the TSV inductors increases, the equivalent series resistance (ESR) increases. To reduce the ESR, the inductor may include parallel TSV paths in its coils that extend through parallel TSVs, the metal layer, and the redistribution layer, all in a parallel fashion.

Figure 5:
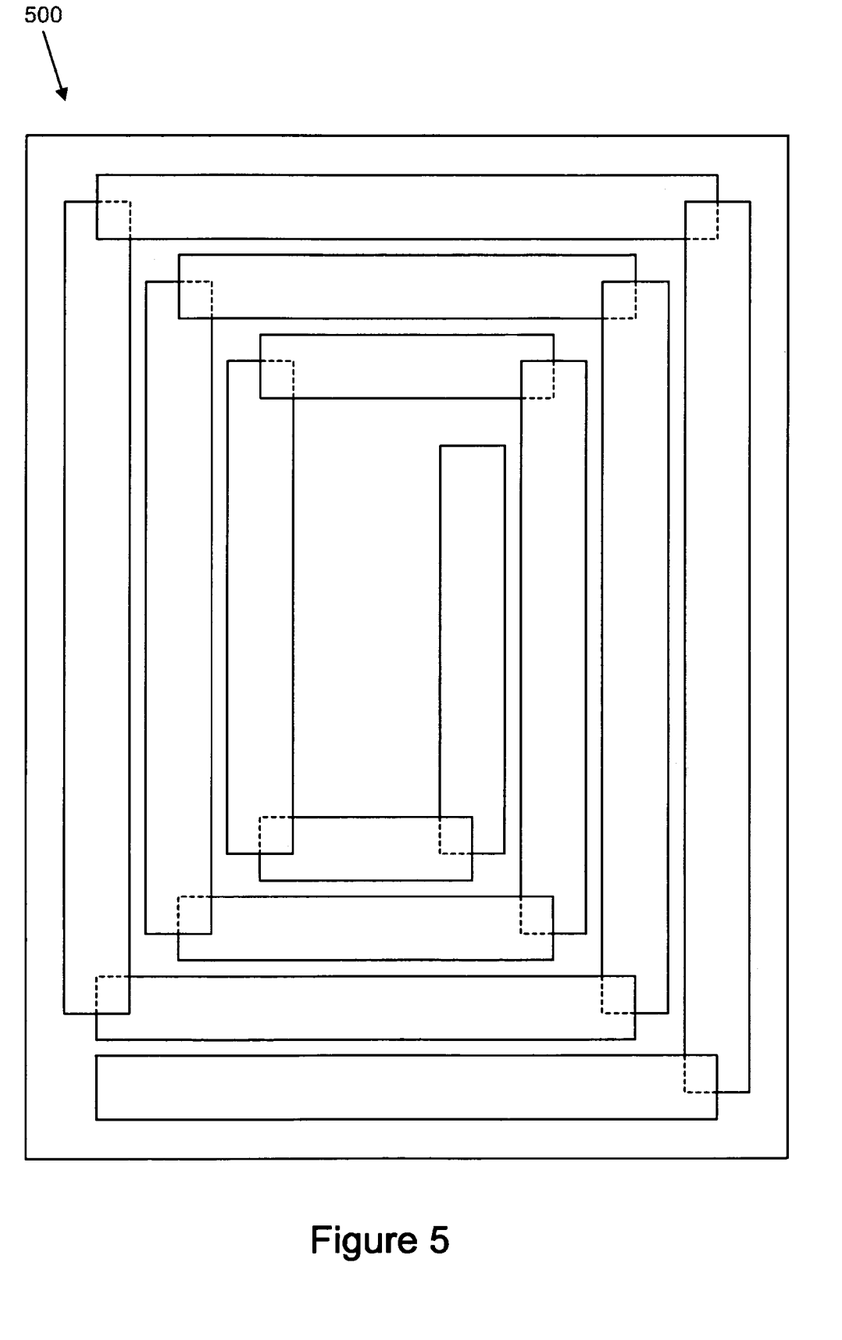
FIG. 5 is a top plan view of a lateral inductor for a voltage regulator, according to aspects of the disclosure.

Alternatively, lateral inductors can be used in the voltage controller, such as the lateral inductor 500 shown in FIG. 5. Although not shown for sake of clarity, the power stage may be located beneath the space defined by the coil(s) of the lateral inductor. The lateral inductor 500 generally requires about five times the amount of area available on the die as compared to a TSV inductor. However, a magnetic-based lateral inductor may have a higher magnetic density and a lower area requirement as a result, which makes it an alternative option for some applications.

The voltage regulators for individual dies that are described above may be incorporated into a three-dimensional multi-stack integrated circuit. Such circuits often have multiple dies that are electrically coupled together in a vertical fashion. For example, a three-dimensional stack may include two dies that each have an inductor that includes a coil and defines an interior space and a capacitor that is electrically coupled to and located within the interior space of the inductor. In this example, the inductor, capacitor and the driver/pre-driver combination, sometimes referred to as a power stage, as described above, are located on the die itself. These power stages are electrically coupled to a voltage controller that controls the duty cycle of the switching clock, which is electrically coupled to the power stage. The three-dimensional multi-stack may have a single voltage controller that is located on one of the dies and electrically coupled to and controls the duty cycle of the switching clock of the power stages of multiple dies or all of the dies in the stack. Alternatively, a voltage controller is located on each die and is electrically coupled with the corresponding power stage on each die. In both examples, the power stage may be located within the interior space of the inductor on the die on which it is located. These dies include any suitable combination of logic dies and memory dies. In some examples in which there is a single voltage controller controlling the duty cycle of the switching clocks of power stages located within multiple dies within a stack, the voltage controller is located on the logic die of the stack and it may be located within the inductor of the logic die or in any other suitable location on the logic die. Such a controller can also be placed elsewhere within the stack.

Figure 6:
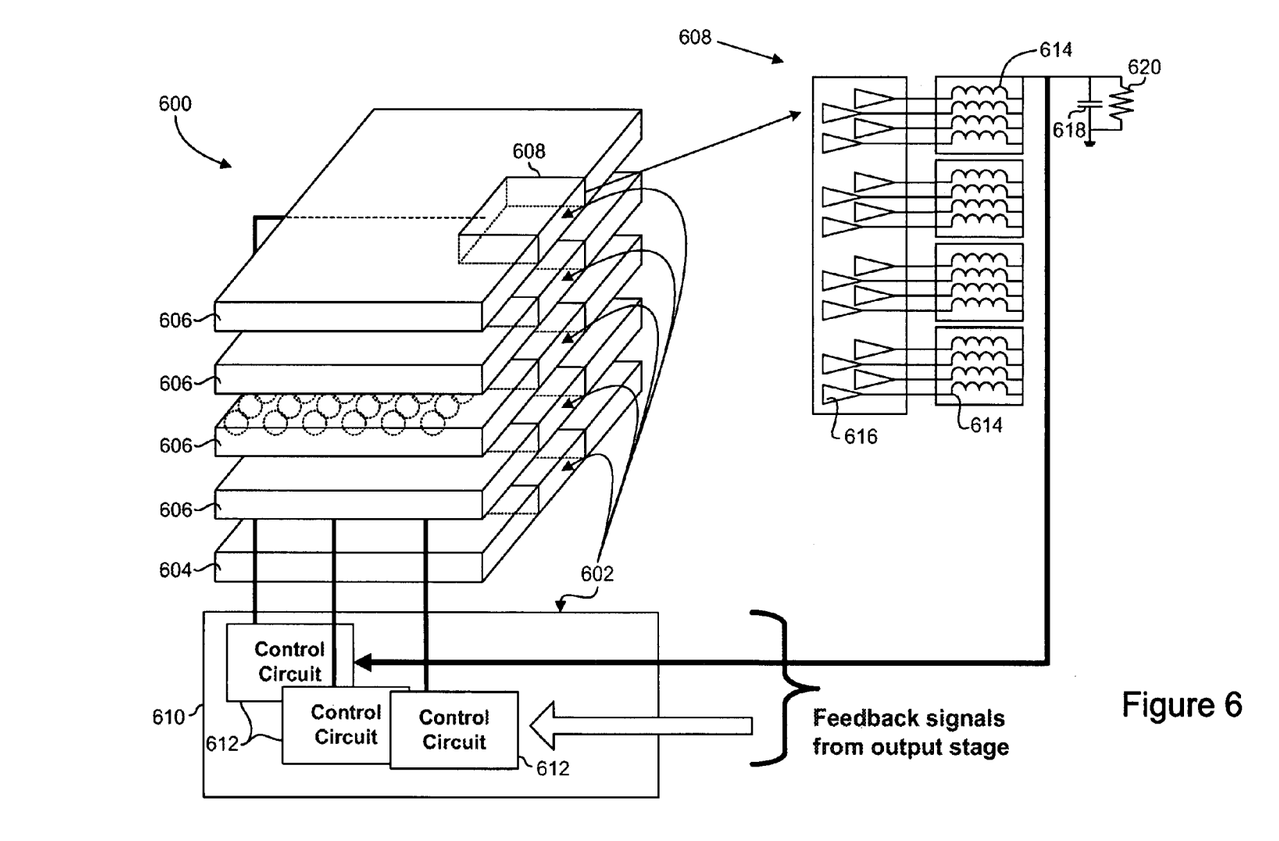
FIG. 6 is a perspective view of a multi-stack integrated circuit architecture with an integrated voltage regulator, according to embodiments of the invention.

FIG. 6 illustrates a three-dimensional multi-stack integrated circuit architecture 600 with a distributed voltage regulator 602. The multi-stack is considered three-dimensional because the circuit extends both horizontally on each die layer and vertically between the dies. The multi-stack 600 shown in FIG. 6 includes a single logic die 604 and four memory dies 606, although alternative configurations include any suitable number of both logic and memory dies. In this example, the logic die 604 is on the bottom of the stack 600, although it can be located in any other suitable location in alternative examples. The dies 604, 606 may be electrically coupled to each other. Each die 604, 606 is electrically coupled to at least one of the voltage regulators 602 described above. The power stage 608 of the voltage regulators 602, which regulates the voltage rail of each die, is located on each die itself, although its associated voltage controller 610 may be located on the die or on another die within the stack 600. In the example shown in FIG. 6, the voltage controller 610 includes multiple control circuits 612 that control the switching clock of the various power stages located on each of the dies 604, 606 separately based on the individual die's voltage needs. One or more of the control circuits 612 may control the switching clock to multiple dies in other configurations.

Each die includes a power stage that regulates the voltage rail in each die and includes an inductor, a capacitor, and one or more driver/pre-drivers. In the example shown in FIG. 6, each power stage 608 includes a four phase TSV inductor that has four inductors 614, four corresponding driver/pre-drivers 616 and the corresponding capacitor 618. The ability to regulate the voltage rail of each die independently provides granular power control over the stack 600 as a whole. This ability to control voltage rails to each of the dies 604, 606 also extends to being able to control voltage rails distributed to any intermediate layers that are located between the dies as well. The power stage 608 is physically located closer to the load where the current is delivered to provide the power, enabling faster ramp up/ramp down time for the regulator in addition to higher efficiency.

Alternatively, a voltage controller may be included on each individual die and in conjunction with a power stage located on each die, regulating voltage rails to each die in this manner. Any one or more of these voltage regulators attached to the multiple dies also may distribute voltage rails to an intermediate layer that is located between the dies, if one is present. In this example, the voltage regulators operate independently of one another and may be beneficial over the examples in which a single voltage controller is electrically coupled to power stages in multiple dies.

Embodiments of the disclosed voltage regulators for multi-stack integrated circuits may be incorporated in various types of architectures. For example, certain embodiments may be implemented as any of or a combination of the following: one or more microchips or integrated circuits interconnected using a motherboard, a graphics and/or video processor, a multicore processor, hardwired logic, software stored by a memory device and executed by a microprocessor, firmware, an application specific integrated circuit (ASIC), and/or a field programmable gate array (FPGA). The term "logic" as used herein may include software, hardware, or any combination thereof.

Figure 7:
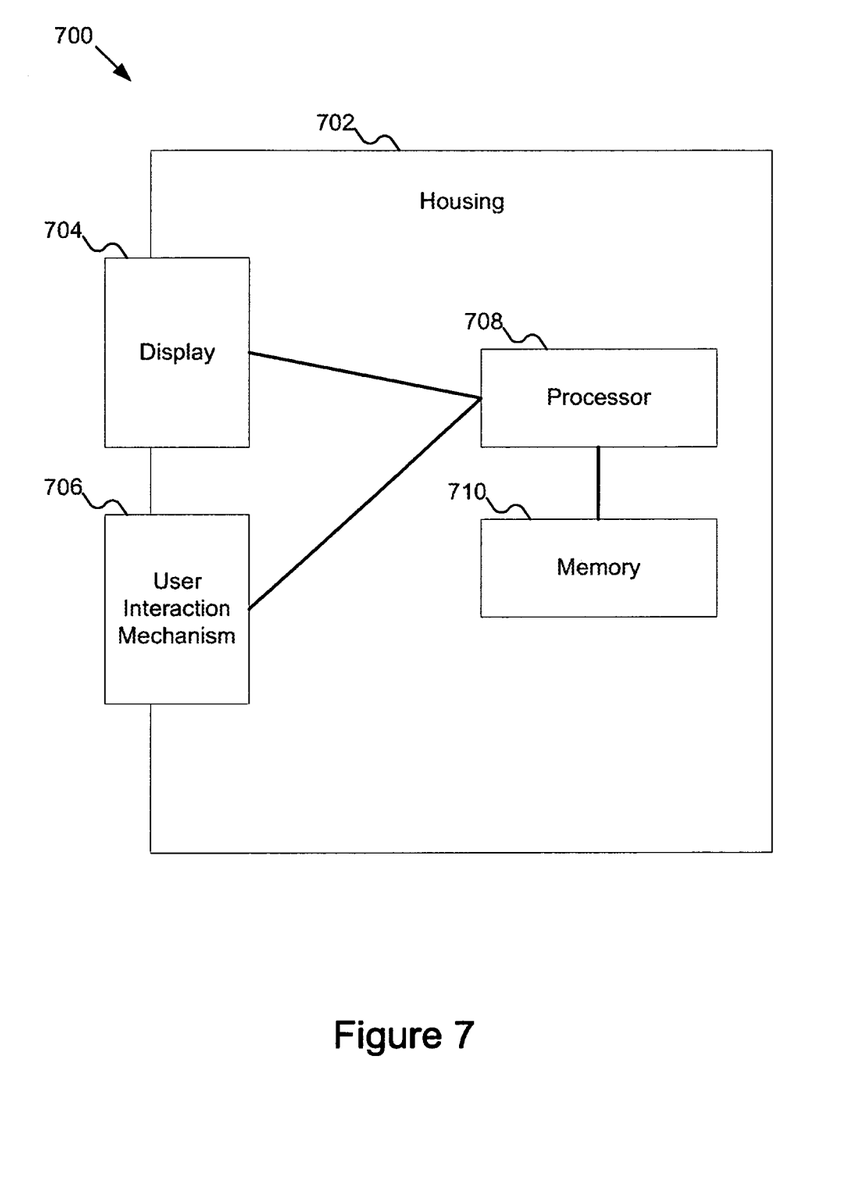
FIG. 7 is a block diagram of an electronic device in which embodiments of the invention may be included.

FIG. 7 illustrates an example of an electronic device 700 in which embodiments of the disclosed technology may be implemented. The electronic device 700 may include, but is not limited to, a personal computing device such as a desktop or laptop computer, a mobile device such as a handheld or tablet computing device, a mobile communications device such as a smartphone, or an industry-specific machine such as a self-service kiosk or automated teller machine (ATM).

The electronic device 700 includes a housing 702, a display 704 in association with the housing 702, a user interaction mechanism 706 in association with the housing 702, a processor 708 within the housing 702, and a memory 710 within the housing 702. The user interaction mechanism 706 may include a physical device, such as a keyboard, mouse, microphone, speaking, or any combination thereof, or a virtual device, such as a virtual keypad implemented within a touchscreen. The processor 708 may perform any of a number of various operations. The memory 710 may store information used by or resulting from processing performed by the processor 708.

It will be appreciated that variations of the above-disclosed voltage regulators and other features and functions, or alternatives thereof, may be desirably combined into many other different systems, methods, or applications. Also various presently unforeseen or unanticipated alternatives, modifications, variations, or improvements therein may be subsequently made by those skilled in the art which also are intended to be encompassed by the following claims.

What is claimed is:

1. A voltage regulator, comprising:
   an inductor that includes a coil looping an interior space, the inductor located on a die;
   a voltage controller electrically coupled to the inductor and located on the die within the interior space; and
   a capacitor electrically coupled to the inductor and the voltage controller and located on the die within the interior space.

2. The voltage regulator of claim 1, wherein the inductor comprises a lateral inductor.

3. The voltage regulator of claim 1, wherein the inductor comprises a through silicon via inductor.

4. The voltage regulator of claim 1, wherein the die includes a bulk silicon portion and a metal stack portion, and a first through silicon via and a second through silicon via extending through the bulk silicon portion, and wherein the coil of the inductor extends through the first through silicon via and the second through silicon via.

5. The voltage regulator of claim 4, wherein the metal stack includes a metal layer, and wherein the coil extends through the first through silicon via, the metal layer, and the second through silicon via.

6. The voltage regulator of claim 5, further comprising a redistribution layer secured to a back side of the die, wherein the coil extends through the first through silicon via, the metal layer, the second through silicon via, and the redistribution layer.

7. The voltage regulator of claim 4, wherein the coil is a first coil and the inductor includes a second coil that in conjunction with the first coil defines the interior space, and wherein the bulk silicon portion includes a third through silicon via and a fourth through silicon via, and wherein the second coil extends through the third through silicon via and the fourth through silicon via.

8. The voltage regulator of claim 1, wherein the voltage controller is an advanced digital voltage controller.

9. The voltage regulator of claim 1, wherein the capacitor includes a metal insulated metal capacitor.

10. The voltage regulator of claim 1, wherein the inductor is located along a perimeter of the die.

11. The voltage regulator of claim 1, wherein the inductor is located within an interior portion of the die.

12. A voltage regulator, comprising:
- a die having a bulk silicon portion and a metal stack portion, the die including a first through silicon via and a second through silicon via;
- a redistribution layer secured to the bulk silicon portion on a back side of the die;
- a through silicon via inductor that includes a coil looping an interior space, the through silicon via inductor located on the die in which the coil extends through the metal stack, first through silicon via, the redistribution layer, the second through silicon via, and back through the metal stack;
- a voltage controller electrically coupled to the through silicon via inductor; and
- a capacitor electrically coupled to the inductor and the voltage controller, and located on the die within the interior space.

13. The voltage regulator of claim 12, wherein the voltage controller is located on the die within the interior space of the inductor.

14. The voltage regulator of claim 12, wherein the coil is a first coil and the die further includes a third through silicon via and a fourth through silicon via, and the through silicon via inductor further includes a second coil that extends through the third through silicon via, the metal stack, the redistribution layer, the fourth through silicon via, and the metal layer, and wherein the first coil and the second coil together define the interior space.

15. The voltage regulator of claim 12, wherein the voltage controller is an advanced digital voltage controller.

16. The voltage regulator of claim 12, wherein the capacitor includes a metal insulated metal capacitor.

17. The voltage regulator of claim 12, wherein the through silicon via inductor is located along a perimeter of the die.

18. The voltage regulator of claim 12, wherein the through silicon via inductor is located within an interior portion of the die.

19. A three-dimensional stack, comprising:
- a first die having:
  - a first inductor that includes a first coil defining a first interior space, the first inductor located on the first die;
  - a first capacitor electrically coupled to the first inductor and located on the first die within the first interior space;
- a second die adjacent to the first die and having:
  - a second inductor that includes a second coil defining a second interior space, the second inductor located on the second die;
  - a second capacitor electrically coupled to the second inductor and located on the second die within the second interior space; and
- a voltage controller electrically coupled to the first die and the second die.

20. The three-dimensional stack of claim 19, wherein the first die is a logic die and the second die is a memory die.

21. The three-dimensional stack of claim 19, further comprising a third die having a third inductor that includes a third coil defining a third interior space, the third inductor located on the third die and a third capacitor electrically coupled to the third inductor and located on the third die within the third interior space, and wherein the voltage controller is electrically coupled to the third die.

22. The three-dimensional stack of claim 21, wherein the first die is a logic die, the second die is a first memory die, and the third die is a second memory die.

23. The three-dimensional stack of claim 19, wherein the voltage controller is located on the first die.

24. The three-dimensional stack of claim 23, wherein the first die is a logic die.

25. The three-dimensional stack of claim 19, wherein the voltage controller controls the duty cycle of a switching clock that is electrically coupled to the first die and the second die.

* * * * *